United States Patent
Chen et al.

(10) Patent No.: US 9,263,354 B2
(45) Date of Patent: Feb. 16, 2016

(54) PILLAR STRUCTURE HAVING CAVITIES

(71) Applicant: Taiwan Semiconductor Manufacturing Company, Ltd., Hsin-Chu (TW)

(72) Inventors: Ying-Ju Chen, Tuku Township (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 14/216,656

(22) Filed: Mar. 17, 2014

(65) Prior Publication Data

US 2015/0262895 A1    Sep. 17, 2015

(51) Int. Cl.
*H01L 21/30* (2006.01)
*H01L 21/46* (2006.01)
*H01L 21/66* (2006.01)

(52) U.S. Cl.
CPC .............. *H01L 22/32* (2013.01); *H01L 22/14* (2013.01)

(58) Field of Classification Search
CPC .............. H01L 21/0228; H01L 21/845; H01L 21/28079; H01L 21/7682; H01L 21/31683; H01L 21/28556; H01L 23/4951; H01L 23/3114; H01L 27/0924; H01L 27/203; H01L 51/0034; H01L 51/0043; H01L 51/4226
USPC .......... 438/456, 106, 680, 455, 679; 257/643, 257/678, E21.007, E21.014, E21.126, 257/E21.127, E21.17, E21.267, E21.278, 257/E21.293, E21.32, E21.545, E21.546
See application file for complete search history.

(56) References Cited

U.S. PATENT DOCUMENTS

| | | | |
|---|---|---|---|
| 7,495,460 B2* | 2/2009 | Itakura et al. | 324/750.06 |
| 7,855,569 B2* | 12/2010 | Natsuhara et al. | 324/750.05 |
| 7,986,146 B2* | 7/2011 | Levinson et al. | 324/525 |
| 8,182,288 B1* | 5/2012 | Lin | 439/607.01 |
| 2011/0140571 A1* | 6/2011 | Tange et al. | 310/311 |

* cited by examiner

*Primary Examiner* — David Nhu
(74) *Attorney, Agent, or Firm* — Slater & Matsil, L.L.P.

(57) ABSTRACT

An apparatus comprises a pillar formed on a top surface of a semiconductor substrate, wherein the pillar comprises a first pillar region, a second pillar region and a first cavity formed between the first pillar region and the second pillar region, and wherein the first cavity is configured to accommodate a probe pin.

20 Claims, 8 Drawing Sheets

PILLAR STRUCTURE HAVING CAVITIES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. Interconnection structures of a semiconductor device may comprise a plurality of lateral interconnections such as metal lines and a plurality of vertical interconnections such as vias, plugs and/or the like. The metal lines of the metallization layers are separated by dielectric layers. Trenches and vias are formed in the dielectric layers to provide an electrical connection between metal lines. Various active circuits of a semiconductor device may be coupled to external circuits through a variety of conductive channels formed by the vertical and lateral interconnections.

In the manufacturing of semiconductor devices, probing is a process for determining the quality of semiconductor chips on wafers. The semiconductor devices must be tested in order to ensure that a functional device has been manufactured. Subsequently, only those chips that pass the probe tests are packaged. These tests are usually performed by contacting a plurality of probe pins to their respective testing pads such as bumps of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
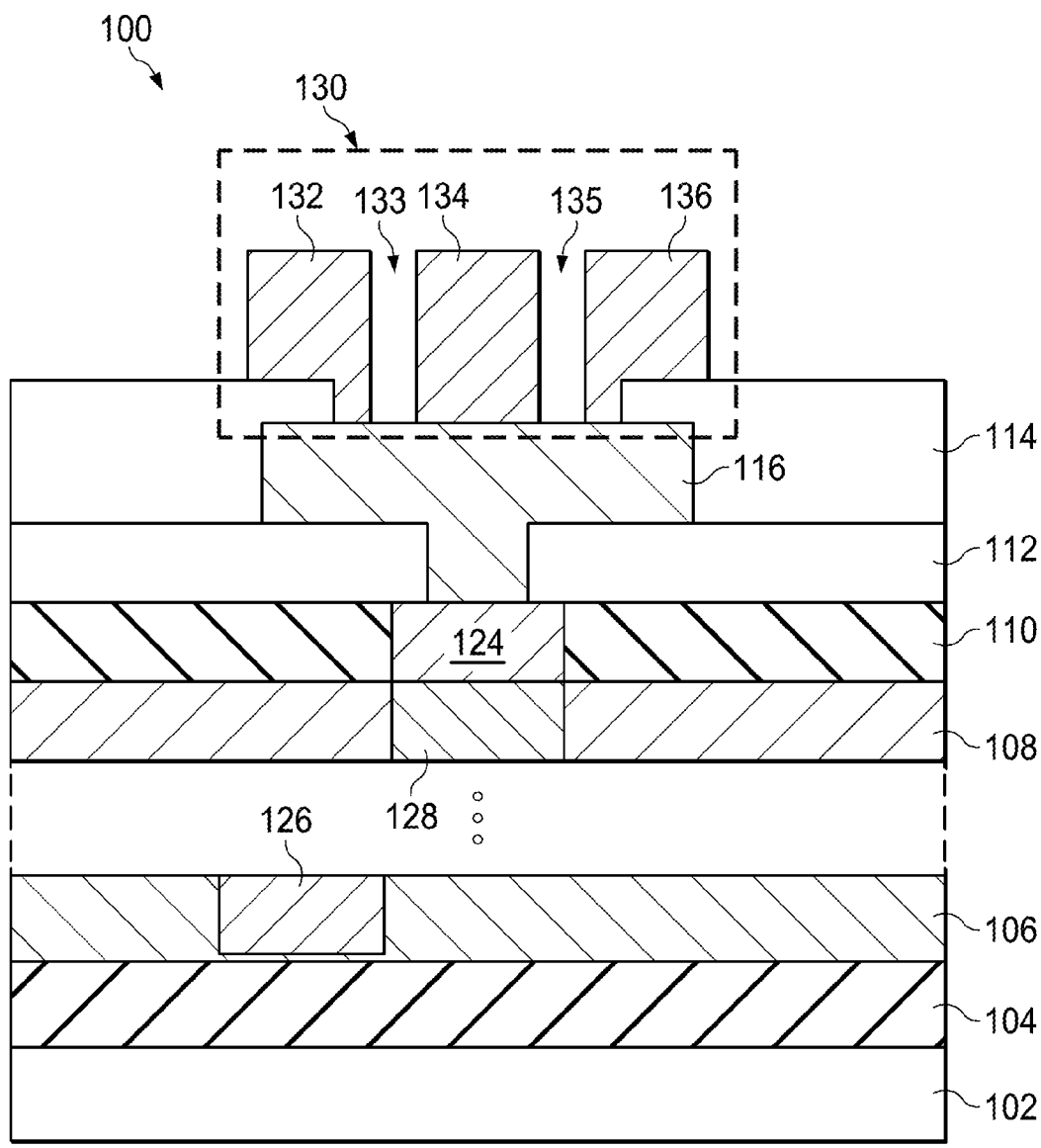
FIG. 1 illustrates a cross sectional view of a semiconductor device having a plurality of cavities in a pillar in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a semiconductor device having a plurality of cavities in a pillar in accordance with various embodiments of the present disclosure. As shown in FIG. 1, the semiconductor device 100 includes a pillar 130 formed over a substrate 102. There may be a plurality of cavities (e.g., cavities 133 and 135) formed in the pillar 130. As a result, the pillar 130 is divided into several portions. In some embodiments, the pillar 130 may include two cavities 133 and 135. The cavities 133 and 135 divide the pillar 130 into three portions, namely a first pillar portion 132, a second pillar portion 134 and a third pillar portion 136 as shown in FIG. 1.

One advantageous feature of having the cavities shown in FIG. 1 is that the cavities 133 and 135 help to achieve a highly reliable probing test. More particularly, a probing test may be applied to a semiconductor wafer (not shown) before the wafer is sawed into a plurality of chips. The probing test may be performed by contacting a plurality of probe pins to their respective contact regions of the wafer, and performing one or more functional tests. In comparison with a semiconductor device having conventional pillars, the cavities 133 and 135 shown in FIG. 1 help to prevent the probe pins from slipping so as to achieve a reliable test. The detailed process of how to prevent a probe pin from slipping will be illustrated below with respect to FIG. 3.

It should be recognized that while FIG. 1 illustrates the semiconductor device 100 with one pillar having two cavities, the semiconductor device 100 could accommodate any number of pillars. Depending on design needs, each pillar may accommodate any number of cavities. One pillar and two cavities are illustrated for simplicity.

The pillar 130 may be formed of suitable conductive materials such as copper, nickel, gold, palladium, any combinations thereof and/or the like. The pillar 130 may form a connector type, which is alternatively referred to as a pillar bump or a copper pillar bump. In accordance with some embodiments, the pillar 130 may be a copper bump having a plurality of cavities. The copper bump may be of a height of approximately 45 um.

In accordance with some embodiments, the cavities 133 and 135 may be formed by suitable semiconductor fabrication techniques. For example, a patterned mask (not shown) may be formed over the semiconductor device 100. The patterned mask defines the location and size of the cavities 133 and 135. The patterned mask may be a patterned photoresist mask, a hard mask, any combinations thereof and/or the like.

The pillar 130 shown in FIG. 1 may be formed of a variety of semiconductor packaging technologies such as chemical vapor deposition (CVD), physical vapor deposition (PVD), sputtering, electroplating and/or the like. As known in the art, in order to insure the reliable adhesion and electrical continuity between the copper pillar bump and the component underneath the copper pillar bump (e.g., bond pad 116), additional layers including a barrier layer, an adhesion layer and a seed layer may be formed between the copper pillar bump and the bond pad 116.

As shown in FIG. 1, the semiconductor device 100 comprises a substrate 102. The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, CVD and plasma enhanced chemical vapor deposition (PECVD). It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 1, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 1 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extremely low-k dielectric material) and conductive materials (e.g., copper).

A dielectric layer 110 is formed on top of the top metallization layer 108. As shown in FIG. 1, a top metal connector 124 is embedded in the dielectric layer 110. In particular, the top metal connector provides a conductive channel between the metal line 128 and the electrical connection structure (e.g., pillar 130) of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, extremely low-k (ELK) dielectrics such as porous carbon doped silicon dioxide can be employed to form the first passivation layer 112. The first passivation layer 112 may be formed through any suitable techniques such as CVD. As shown in FIG. 1, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 1, a bond pad 116 is formed in the openings of the first passivation and second passivation layers. The bond pad 116 may be made of metallic materials such as copper, copper alloys, aluminum, silver, gold and any combinations thereof, and/or multi-layers thereof. The bond pad 116 may be formed by suitable techniques such as CVD. Alternatively, the bond pad 116 may be formed by sputtering, electroplating and/or the like.

The bond pad 116 may be enclosed by the first and second passivation layers 112 and 114. In particular, a bottom portion of the bond pad 116 is embedded in the first passivation layer 112 and a top portion of the bond pad 116 is embedded in the second passivation layer 114. The first and second passivation layers 112 and 114 overlap and seal the edges of the bond pad 116 so as to improve electrical stability by preventing the edges of the bond pad 116 from corrosion. In addition, the passivation layers may help to reduce the leakage current of the semiconductor device.

Figure 2:
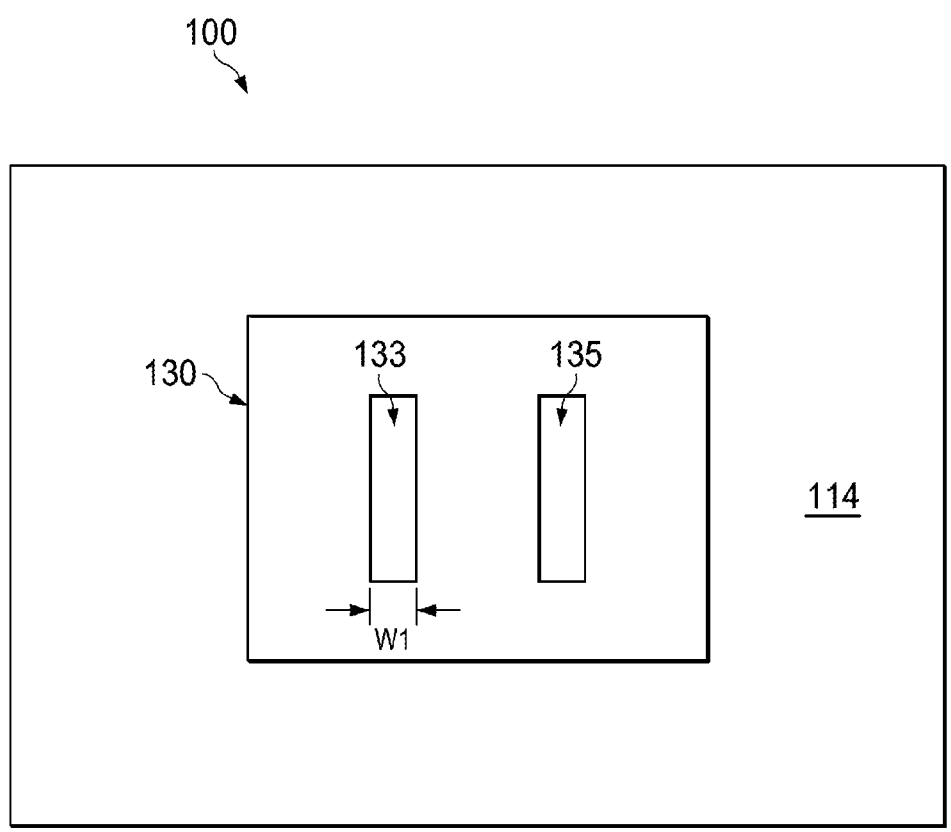
FIG. 2 illustrates a top view of the semiconductor device shown in FIG. 1 in accordance with various embodiments of the present disclosure.

FIG. 2 illustrates a top view of the semiconductor device shown in FIG. 1 in accordance with various embodiments of the present disclosure. As shown in FIG. 2, the pillar 130 is formed over the second passivation layer 114. There may be two cavities 133 and 135 formed in the pillar 130. As shown in FIG. 2, the cavities 133 and 135 are substantially rectangular in shape. It should be noted that it is within the scope of various embodiments of the present disclosure for the cavities 133 and 135 to comprise other shapes, such as, but no limited to oval, square, circular and/or the like.

In some embodiments, the cavities 133 and 135 are of a rectangular shape. The width of the cavities (e.g., cavity 133) is defined as W1. In some embodiments, W1 is in a range from about 2 um to about 5 um.

Figure 3:
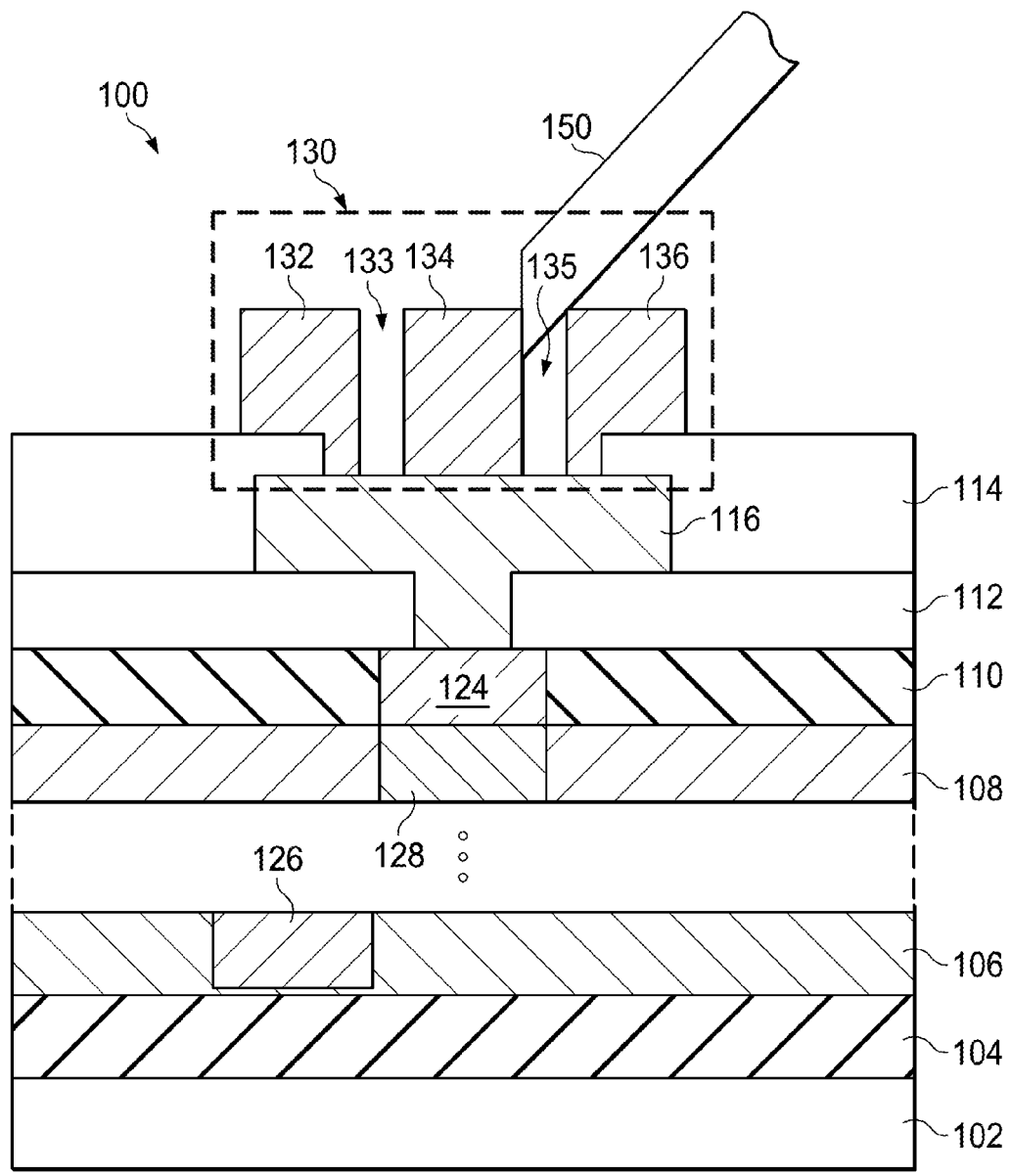
FIG. 3 illustrates a contact scheme between a probe pin and the semiconductor device shown in FIG. 1 in accordance with various embodiments of the present disclosure.

FIG. 3 illustrates a contact scheme between a probe pin and the semiconductor device shown in FIG. 1 in accordance with various embodiments of the present disclosure. The probe pin 150 is attached to a probe card, through which the probe pin may be coupled to an ATE (not shown).

In some embodiments, the probe pin 150 may be aligned to the cavity 135 of the pillar 130 of the semiconductor device 100. Furthermore, the probe card (not shown) may vertically move down until the probe pin 150 is trapped in the cavity 135 as shown in FIG. 3. Such a trapped probe pin helps to provide a reliable contact between the pillar 130 and the probe pin 150.

FIG. 3 further illustrates the probe pin 150 is in direct contact with the sidewall of the cavities (e.g., cavity 135). In some embodiments, after probing, there may be a trace or a mark (not shown) on the probed area of the sidewall of the cavity.

As shown in FIG. 3, the cavities 133 and 135 are through holes extending from the top surface of the pillar 130 to a top surface of the bond pad 116. In other words, the depth of the cavities 133 and 135 is equal to the height of the pillar 130. It should be noted that the depth of the cavities 133 and 135 used in FIG. 3 is selected purely for demonstration purposes and are not intended to limit the various embodiments of the present disclosure to any particular depth. In some embodiments, the cavities 133 and 135 may be implemented as shallow trenches formed in the pillar 130. The shallow trenches may be of a depth approximately equal to one tenth of the height of the pillar 130.

Figure 4:
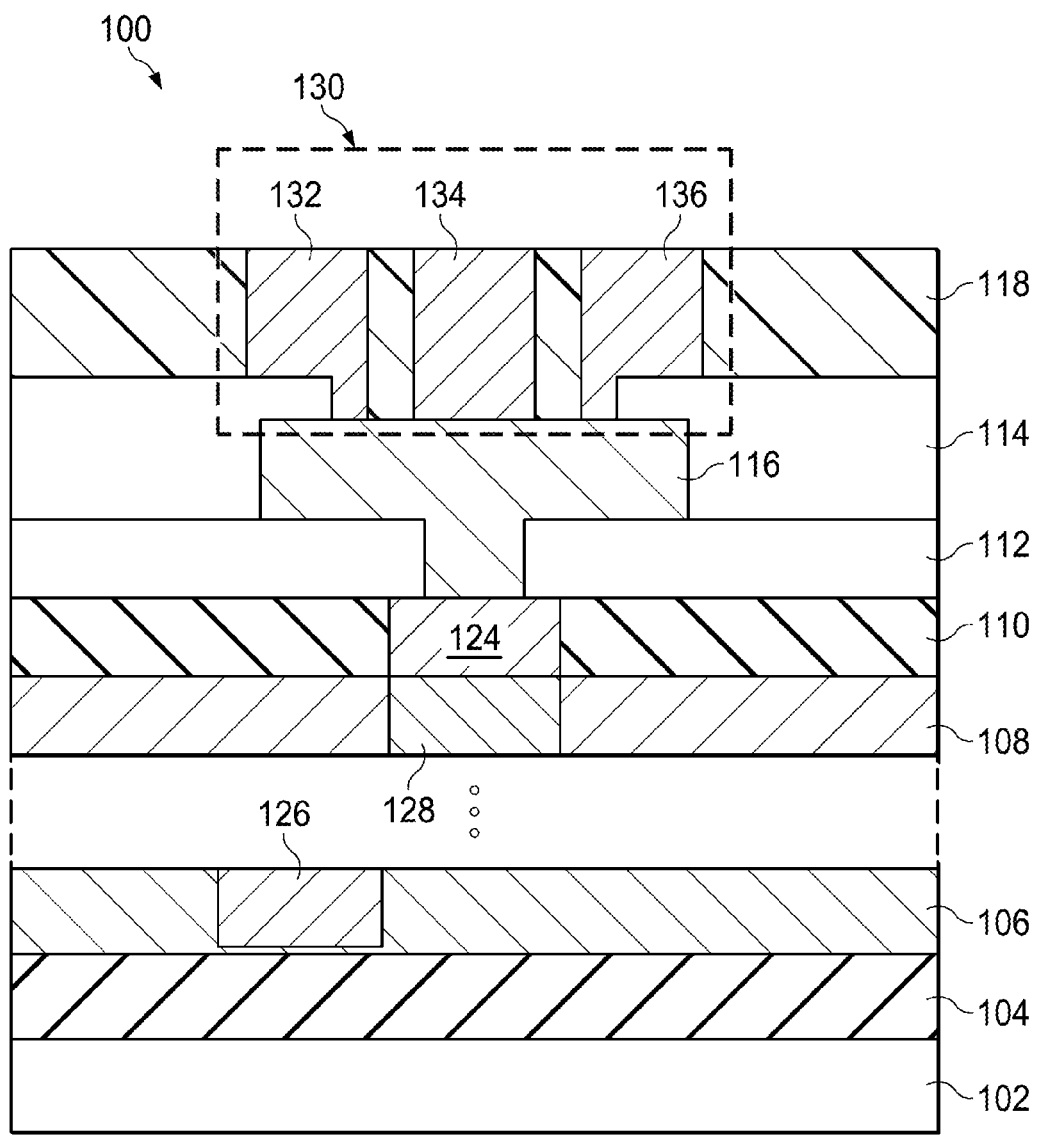
FIG. 4 illustrates a cross sectional view of the semiconductor device shown in FIG. 1 after a polymer layer is formed over the semiconductor device in accordance with various embodiments of the present disclosure.

FIG. 4 illustrates a cross sectional view of the semiconductor device shown in FIG. 1 after a polymer layer is formed over the semiconductor device in accordance with various embodiments of the present disclosure. A polymer layer 118 is formed on top of the second passivation layer 114. After the polymer layer 118 is formed, the cavities 133 and 135 are filler with the polymer material. In addition, the pillar 130 may be embedded in the polymer layer 118.

The polymer layer 118 may be made of polymer materials such as epoxy, polyimide, polybenzoxazole (PBO), silicone, benzocyclobutene (BCB), molding compounds and/or the like. In accordance with various embodiments, the polymer layer 118 may be formed of PBO. The polymer layer 118 may be made by suitable deposition methods known in the art such as spin coating and/or the like.

Figure 5:
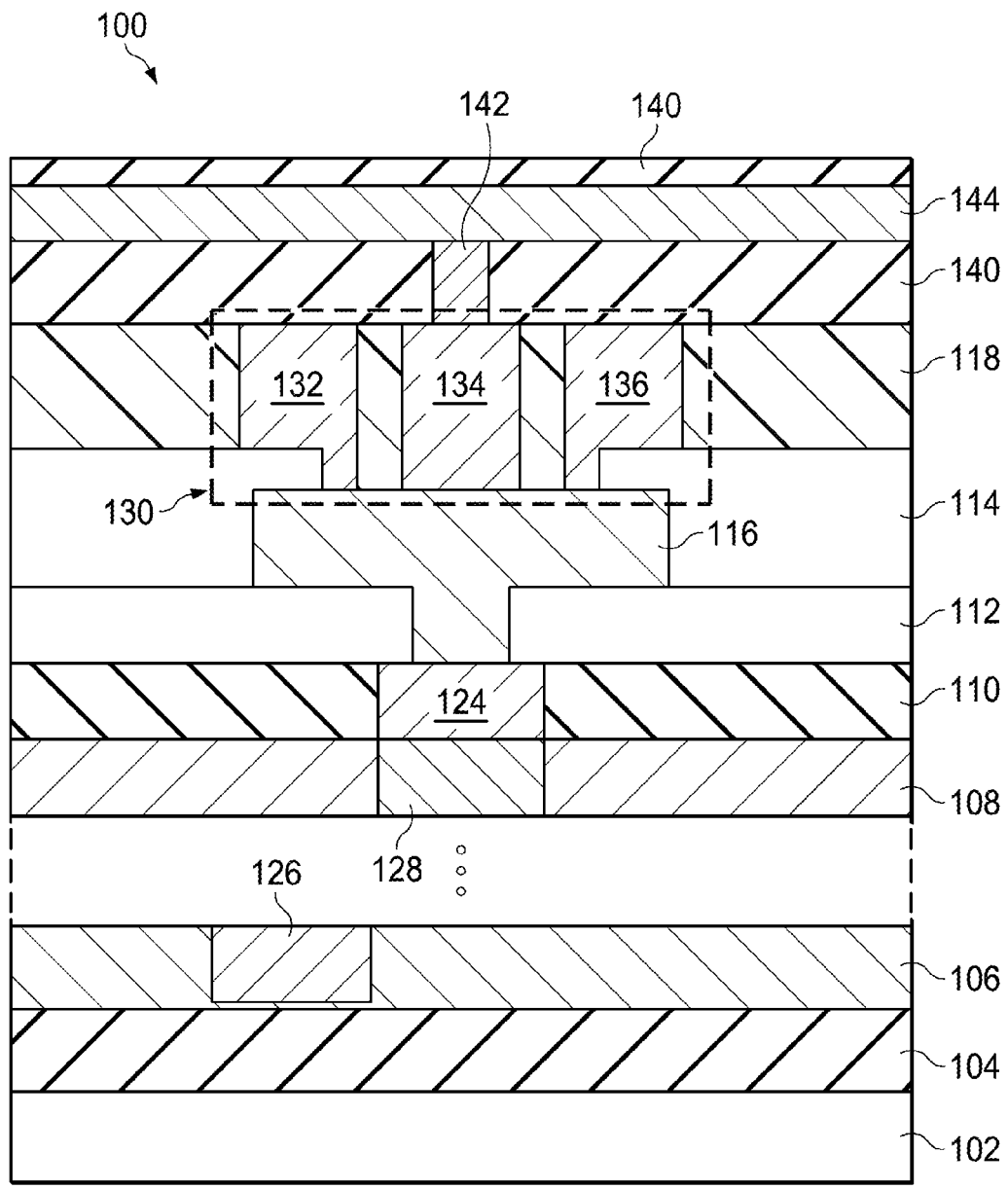
FIG. 5 illustrates a cross sectional view of the semiconductor device shown in FIG. 1 after a redistribution layer is formed over the semiconductor device in accordance with various embodiments of the present disclosure.

FIG. 5 illustrates a cross sectional view of the semiconductor device shown in FIG. 1 after a redistribution layer is formed over the semiconductor device in accordance with various embodiments of the present disclosure. A dielectric layer 140 may be deposited over the semiconductor device 100. A redistribution layer 144 and a redistribution layer via 142 may be formed in the dielectric layer 140.

As shown in FIG. 5, the redistribution layer 144 may be connected with the pillar 130 through a redistribution layer via 142. The redistribution layer 144 may provide a conductive path between two adjacent pillars. The formation and operation principles of redistribution layers are well known in the art, and hence are not discussed in detail herein to avoid unnecessary repetition.

Figure 6:
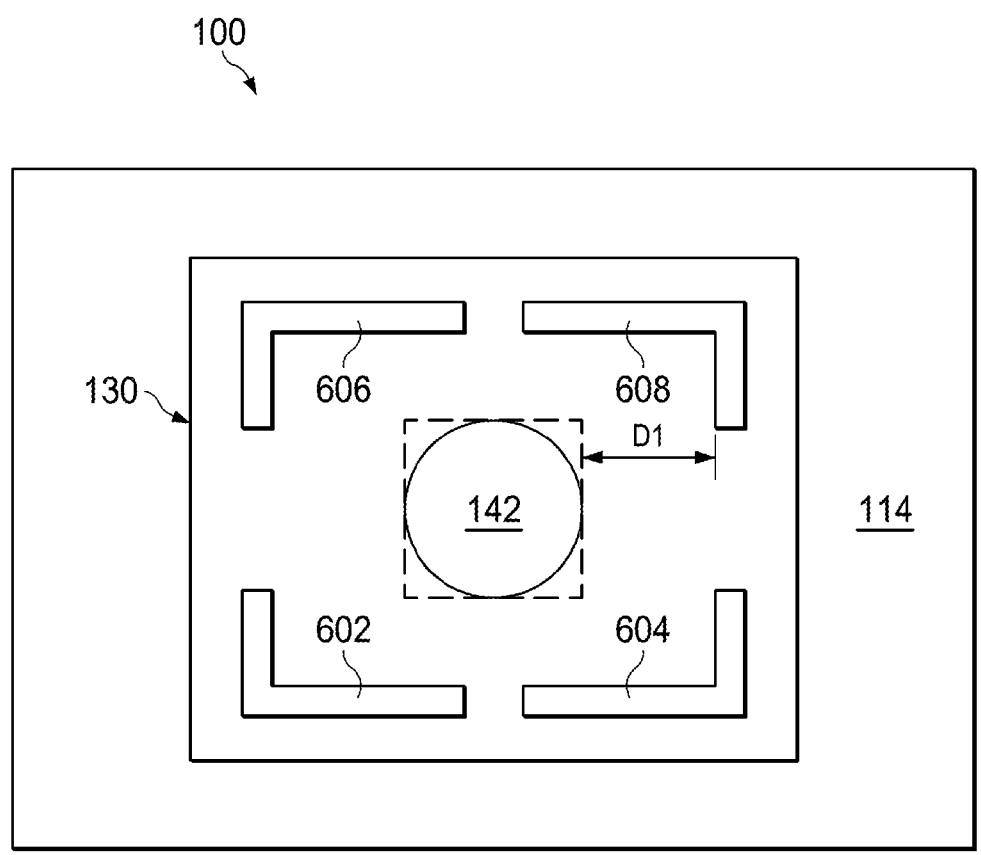
FIG. 6 illustrates a top view of the semiconductor device shown in FIG. 5 in accordance with various embodiments of the present disclosure.

FIG. 6 illustrates a top view of the semiconductor device shown in FIG. 5 in accordance with various embodiments of the present disclosure. As shown in FIG. 6, the pillar 130 is formed over the second passivation layer 114. The redistribution layer via 142 is formed over the pillar 130. In some embodiments, the redistribution layer via 142 may be located in the middle of the top surface of the pillar 130. There may be four cavities 602, 604, 606 and 608 formed in the pillar 130. As shown in FIG. 6, the cavities 602, 604, 606 and 608 are L-shaped cavities from the top view.

It should be noted the L-shaped cavities shown in FIG. 6 are merely an example, which should not unduly limit the scope of the claims. One of ordinary skill in the art would recognize many variations, alternatives, and modifications. For example, it is within the scope of various embodiments of the present disclosure for the cavities to comprise other shapes, such as, but no limited to rectangular, oval, square, or circular and/or the like.

In some embodiments, the redistribution layer via 142 may be surrounded by cavities 602, 604, 606 and 608. The distance between the outer edge of the redistribution layer via 142 and the cavities (e.g., cavity 608) is defined as D1 as shown in FIG. 6. In some embodiments, D1 is greater than about 5 um.

Figure 7:
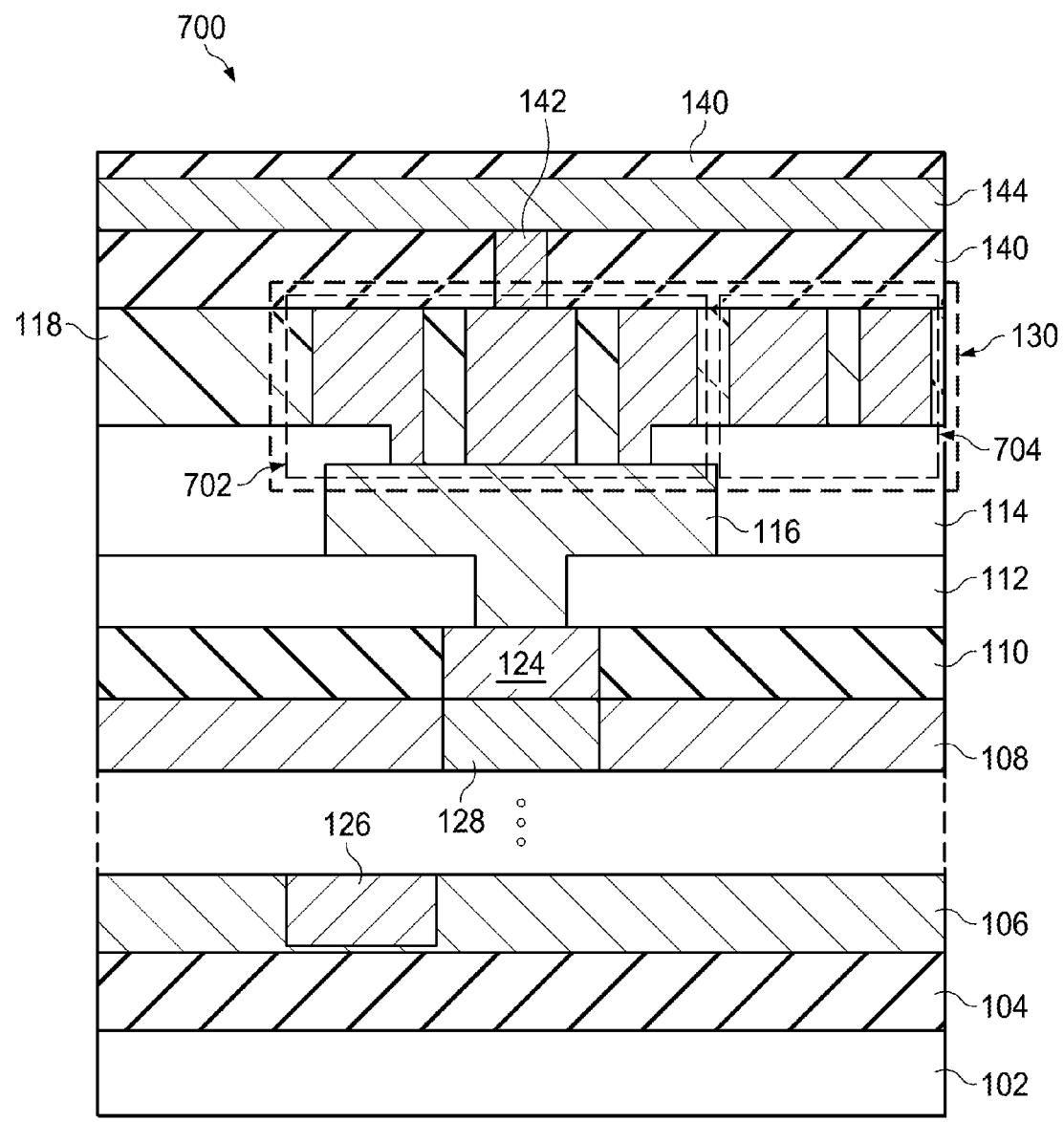
FIG. 7 illustrates a cross sectional view of the semiconductor device shown in FIG. 1 after a redistribution layer is formed over the semiconductor device in accordance with another embodiment of the present disclosure.

FIG. 7 illustrates a cross sectional view of the semiconductor device shown in FIG. 1 after a redistribution layer is formed over the semiconductor device in accordance with another embodiment of the present disclosure. The semiconductor device 700 shown in FIG. 7 is similar to the semiconductor device 100 shown in FIG. 5 except that the pillar 130 of FIG. 7 is divided into two separated regions. A first region 702 is used for a landing region for the redistribution layer via 142. A second region 704 is used for chip probing.

As shown in FIG. 7, there may be two cavities 706 and 708 in the second region 704. The width of the cavities 706 and 708 is similar to that shown in FIGS. 1-3, and hence is not discussed again herein.

FIG. 7 further illustrates the first region 702 is vertically aligned with the bond pad 116. The second region 704 is formed adjacent to the first region 702. In addition, the second region 704 is electrically connected to the first region 702.

Figure 8:
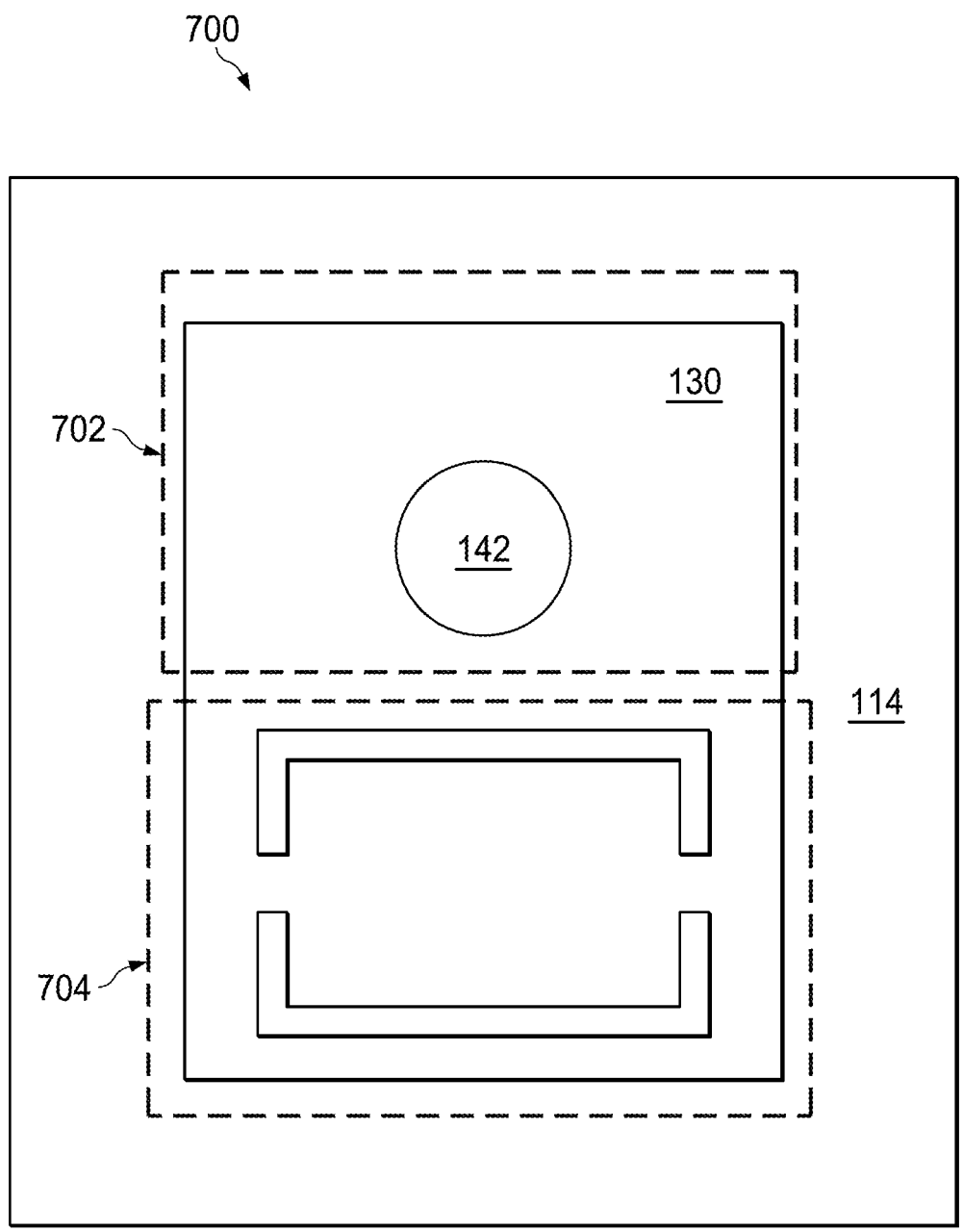
FIG. 8 illustrates a top view of the semiconductor device shown in FIG. 7 in accordance with various embodiments of the present disclosure.

FIG. 8 illustrates a top view of the semiconductor device shown in FIG. 7 in accordance with various embodiments of the present disclosure. As shown in FIG. 8, the pillar 130 is divided into two separated regions, namely a via landing region and a chip probing region. The via landing region corresponds to the first region 702 shown in FIG. 7. The chip probing region corresponds to the second region 704 shown in FIG. 7. The redistribution layer via 142 is located in the middle of the via landing region. The distance between the redistribution layer via 142 and the nearest cavity is greater than 5 um.

In accordance with an embodiment, an apparatus comprises a pillar formed on a top surface of a semiconductor substrate, wherein the pillar comprises a first pillar region, a second pillar region and a first cavity formed between the first pillar region and the second pillar region, and wherein the first cavity is configured to accommodate a probe pin.

In accordance with an embodiment, a device comprises a substrate comprising silicon, a first metal layer formed over the substrate, a second metal layer formed on the first metal layer, a first passivation layer formed over the second metal layer, a second passivation layer formed over the first passivation layer and a bond pad embedded in the first passivation layer and the second passivation layer.

The device further comprises a pillar formed over the bond pad and electrically coupled to the bond pad, wherein the pillar comprises a plurality of cavities and a polymer layer formed over the pillar, wherein the pillar is embedded in the polymer layer.

In accordance with an embodiment, a method comprises providing a semiconductor device comprising a pillar formed on a top surface of a semiconductor substrate, wherein the pillar comprises a first pillar region, a second pillar region and a first cavity formed between the first pillar region and the second pillar region.

The method further comprises inserting a probe pin into the first cavity, wherein the probe pin is in direct contact with the pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a pillar formed on a top surface of a semiconductor substrate, wherein the pillar comprises:
      a first pillar region;
      a second pillar region; and
      a first cavity formed between the first pillar region and the second pillar region, and wherein the first cavity is configured to accommodate a probe pin.

2. The apparatus of claim 1, wherein the pillar is formed of copper.

3. The apparatus of claim 1, further comprising:
   a third pillar region; and
   a second cavity formed between the second pillar region and the third pillar region, wherein the second cavity is configured to accommodate the probe pin.

4. The apparatus of claim 1, further comprising:
   a bond pad formed underlying the pillar and electrically coupled to the pillar; and
   a via formed over the pillar.

5. The apparatus of claim 4, wherein:
   the pillar comprises a via landing region and a cavity region, and wherein the via is located in the via landing region and the first cavity is located in the cavity region.

6. The apparatus of claim 4, wherein:
   the via is surrounded by the first cavity, wherein an edge of the via is separated from an edge of the first cavity by a distance, and wherein the distance is greater than about 5 um.

7. The apparatus of claim 1, wherein:
   the first cavity is of a first width from about 2 um to about 5 um.

8. A device comprising:
   a substrate comprising silicon;
   a first metal layer formed over the substrate;
   a second metal layer formed on the first metal layer;
   a first passivation layer formed over the second metal layer;
   a second passivation layer formed over the first passivation layer;
   a bond pad embedded in the first passivation layer and the second passivation layer;
   a pillar formed over the bond pad and electrically coupled to the bond pad, wherein the pillar comprises a plurality of cavities; and
   a polymer layer formed over the pillar, wherein the pillar is embedded in the polymer layer.

9. The device of claim 8, further comprising:
   a redistribution layer via formed on the pillar; and
   a redistribution layer connected to the pillar through the redistribution layer via.

10. The device of claim 9, wherein:
    the pillar comprises a via landing region and a cavity region, and wherein:
       the via landing region is vertically aligned with the bond pad; and
       the cavity region is formed adjacent to the via landing region.

11. The device of claim 10, wherein:
    an edge of the via in the via landing region is separated from an edge of a nearest cavity in the cavity region by a distance, and wherein the distance is greater than about 5 um.

12. The device of claim 8, wherein:
    the cavities are configured to accommodate a probe pin.

13. The device of claim 12, further comprising:
    a mark on a probed area of a sidewall of the cavity.

14. The device of claim 8, wherein:
    the cavities are of a width from about 2 um to about 5 um.

15. The device of claim 8, wherein:
    the cavities are rectangular in shape.

16. A method of fabricating a device, the method comprising:
    providing a semiconductor device comprising:
       a pillar formed on a top surface of a semiconductor substrate, wherein the pillar comprises:
       a first pillar region;
       a second pillar region; and
       a first cavity formed between the first pillar region and the second pillar region; and
    inserting a probe pin into the first cavity, wherein the probe pin is in direct contact with the pillar.

17. The method of claim 16, further comprising:
    depositing a dielectric material over the pillar, wherein the first cavity is filled with the dielectric material.

18. The method of claim 17, further comprising:
    forming a redistribution layer via over the pillar; and
    forming a redistribution layer, wherein the redistribution layer is coupled to the pillar through the redistribution layer via.

19. The method of claim 18, wherein:
    the redistribution layer via is located in a via landing region of the pillar; and
    the first cavity is located in a cavity region of the pillar.

20. The method of claim 18, wherein:
    the redistribution layer via is surrounded by the cavity.

* * * * *